US007023096B2

(12) United States Patent
Lee et al.

(10) Patent No.: US 7,023,096 B2
(45) Date of Patent: Apr. 4, 2006

(54) MULTI-CHIP PACKAGE HAVING SPACER THAT IS INSERTED BETWEEN CHIPS AND MANUFACTURING METHOD THEREOF

(75) Inventors: Kyu Jin Lee, Chungcheongnam-do (KR); Hyung Jik Byun, Chungcheongnam-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/243,784

(22) Filed: Sep. 12, 2002

(65) Prior Publication Data

US 2003/0062628 A1 Apr. 3, 2003

(30) Foreign Application Priority Data

Sep. 28, 2001 (KR) .............................. 2001-60641

(51) Int. Cl.
*H01L 23/48* (2006.01)

(52) U.S. Cl. ....................... 257/777; 257/685; 257/686

(58) Field of Classification Search ................ 257/777, 257/784, 787, 686

See application file for complete search history.

(56) References Cited

U.S. PATENT DOCUMENTS 5,904,497 A * 5/1999 Akram ....................... 438/106
6,077,724 A 6/2000 Chen .......................... 438/107
6,414,384 B1 * 7/2002 Lo et al. ..................... 257/685
6,472,758 B1 * 10/2002 Glenn et al. ................ 257/777
6,531,784 B1 * 3/2003 Shim et al. ................. 257/777
6,650,006 B1 * 11/2003 Huang et al. ............... 257/686

FOREIGN PATENT DOCUMENTS

JP 10-70232 3/1998
JP 10-270619 10/1998
KR 2000-0044989 7/2000

* cited by examiner

*Primary Examiner*—Luan Thai
(74) *Attorney, Agent, or Firm*—Harness, Dickey & Pierce, P.L.C.

(57) ABSTRACT

A multi-chip package includes a substrate with a chip mounting area and a first chip positioned in the mounting area. A spacer is attached to the active surface of the first chip and has a thickness to allow space for wire-bonding the first chip's active surface to the substrate. A second chip is attached to the spacer over the first chip. Conductive metal wires electrically connect the first and second chips to the substrate. A package body is formed by encapsulating the first and second chips and the conductive metal wires. Ends of the spacer extend to the edge the package body. External connection terminals are attached to the bottom surface of the substrate and a method for the manufacturing thereof.

12 Claims, 8 Drawing Sheets

MULTI-CHIP PACKAGE HAVING SPACER THAT IS INSERTED BETWEEN CHIPS AND MANUFACTURING METHOD THEREOF

BACKGROUND

1. Field of Invention

The present invention relates to a semiconductor packaging technology, and more particularly to a multi-chip package (MCP) with a spacer that is inserted between chips and a manufacturing method thereof.

2. Description of Related Art

It has been long desired to provide low-cost semiconductor chip packages that are lighter, smaller, with higher speed, multi-function, and with improved reliability. In order to satisfy this goal, a multi-chip packaging technique has been developed. The multi-chip package comprises same or different types of plural chips being assembled into a single unit package. Compared to using a plurality of packages, each including a single chip, the multi-chip package has advantages in miniaturization, light-weight, and high surface-mount density.

These multi-chip packages are classified into two types, i.e., a vertical-stacking type and a parallel-aligning type. The former reduces mounting area, while the latter simplifies the manufacturing process and reduces package thickness. In order to achieve miniaturization and light-weight, the vertical-stacking type has been more commonly used in multi-chip packages. The conventional vertical-stacking type of the multi-chip package is described below.

FIG. 1 is a cross-sectional view of a conventional multi-chip package 110. The multi-chip package 110 comprises a first chip 111 mounted on a substrate 121 and a second chip 113 mounted on the first chip 111. The active surfaces 111*a*, 113*a* of the first and second chips 111, 113 are upward. The back surface 111*b* of the first chip 111 is mounted on the substrate 121 and the back surface 113*b* of the second chip 113 is mounted on the active surface of the first chip 111. Chip pads 112 of the first chip 111 and chip pads 114 of the second chip 113 are electrically connected to corresponding bonding pads 123 by bonding wires 141, 143. The entire assembly including the first chip 111, the second chip 113 and other electrical connection elements is encapsulated with an encapsulant such as an epoxy molding resin to form a package body 151. Solder balls 161 are attached to corresponding land patterns of the bottom surface of the substrate 121 and serve as external connection terminals.

The conventional multi-chip package comprises a plurality of semiconductor chips, thereby achieving better electrical performance and higher integrity at lower cost. Further, the area-arrayed external connection terminals of the multi-chip package satisfy the trend of the ever-increasing numbers of input/output pins.

However, this conventional vertical-stacking multi-chip package structure limits the type and the size of chips.

Since the chip requires a bonding area for the wire-bonding, the size of the upper chip should be reduced by being stacked upwards. If the lower chip is smaller than the upper chip, the chip pads of the lower chip are shielded by the upper chip, thereby preventing the wire-bonding between the chip pads of the lower chip and the bonding pads of the substrate.

Moreover, since the conventional multi-chip package needs to be individually assembled, it cannot be mass-produced.

SUMMARY

Accordingly, an object of the present invention is to provide a multi-chip package including a plurality of stacked chips having the same or similar size and allowing wire-bonding between the lower chip and the substrate, and a method for manufacturing the multi-chip package.

Another object of the present invention is to collectively obtain a plurality of multi-chip packages by carrying out the assembly and packaging processes in a strip.

In order to achieve the foregoing and other objects, the present invention provides a multi-chip package including a substrate with a chip mounting area, a first chip having an active surface with chip pads and a back surface attached to the chip mounting area; a spacer attached to the active surface of the first chip between the first chip and the substrate and having a predetermined thickness to obtain space for wire-bonding; a second chip having an active surface with chip pads and a back surface attached to the spacer; conductive metal wires for electrically connecting the first and second chips to the substrate; a package body formed by encapsulating the first and second chips and the conductive metal wires; wherein ends of the spacer extend from the package body and external connection terminals attached to the bottom surface of the substrate.

Further, the present invention provides a method for manufacturing multi-chip packages. The method includes the steps of (a) preparing a substrate strip having a plurality of areas in matrix arrangement, each package area comprising a chip mounting area, and a plurality of bonding pads on the periphery of the chip mounting area; (b) attaching a first chip on each chip mounting area; (c) electrically connecting the first chip to the corresponding bonding pads of the substrate strip by conductive metal wires; (d) attaching a spacer strip on the first chips, the spacer strip having a plurality of spacers in bar form corresponding to either of rows or columns of the package areas (e) attaching a second chip on each spacer over a first chip; (f) electrically connecting the second chip to the corresponding bonding pads of the substrate strip by conductive metal wires; (g) collectively encapsulating the package so as to mold the first chip, the second chip, the conductive metal wires, and electrical connection parts; (h) attaching external connection terminals to the bottom surface of the substrate strip, the external connection terminals being connected to the bonding pads; and (i) cutting the substrate strip having a plurality of package assemblies into unit multi-chip packages.

Preferably, the spacer is located between the opposite edges on the active surface of the first chip, and the first chip is an edge pad type with chip pads on the opposite two edges of the active surface. The first and second chips used are edge pad types, thereby minimizing the length of the wire loop in the metal wires. Preferably, the first and second chips are the same or similar.

Considering the molding, the spacer strip is formed upset or downset. The spacer strip is made of FR-4 or silicon.

BRIEF DESCRIPTION OF THE DRAWINGS

These and other objects, features, and advantages of the present invention will be readily understood with reference to the following detailed description thereof provided in conjunction with the accompanying drawings, wherein like reference numerals designate like structural elements, and in which.

DETAILED DESCRIPTION

Preferred embodiments of the present invention will be described below with reference to the accompanying drawings.

Figure 1:
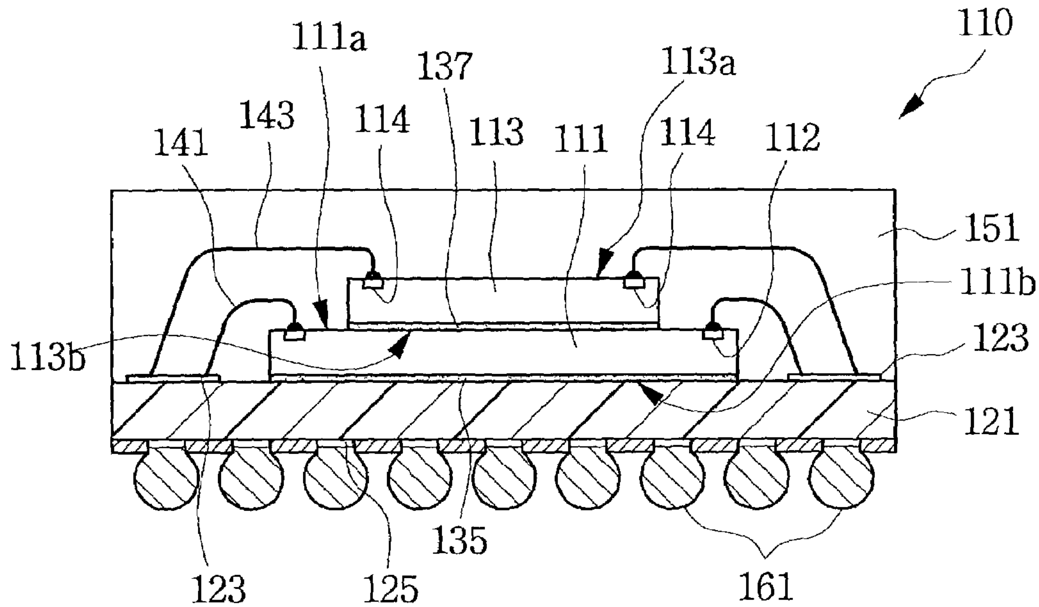
FIG. 1 is a cross-sectional view of a conventional multi-chip package.
Figure 2:
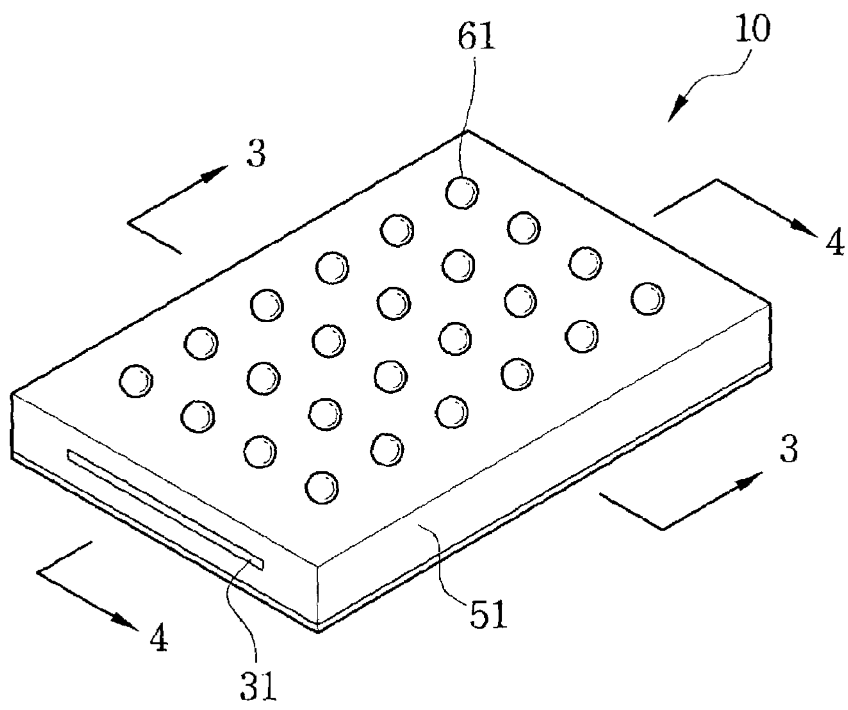
FIG. 2 is a perspective bottom view of a multi-chip package in accordance with an embodiment of the present invention.
Figure 3:
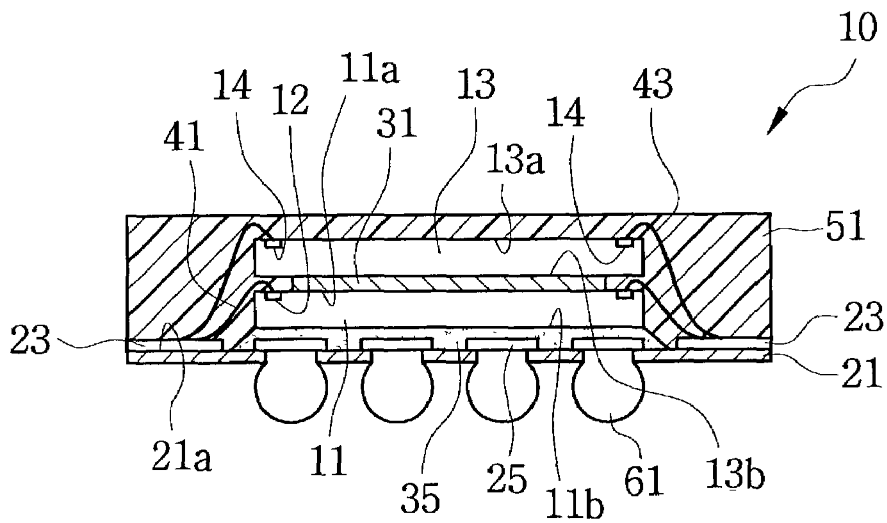
FIG. 3 is a cross-sectional view taken along line 3—3 of FIG. 2.
Figure 4:
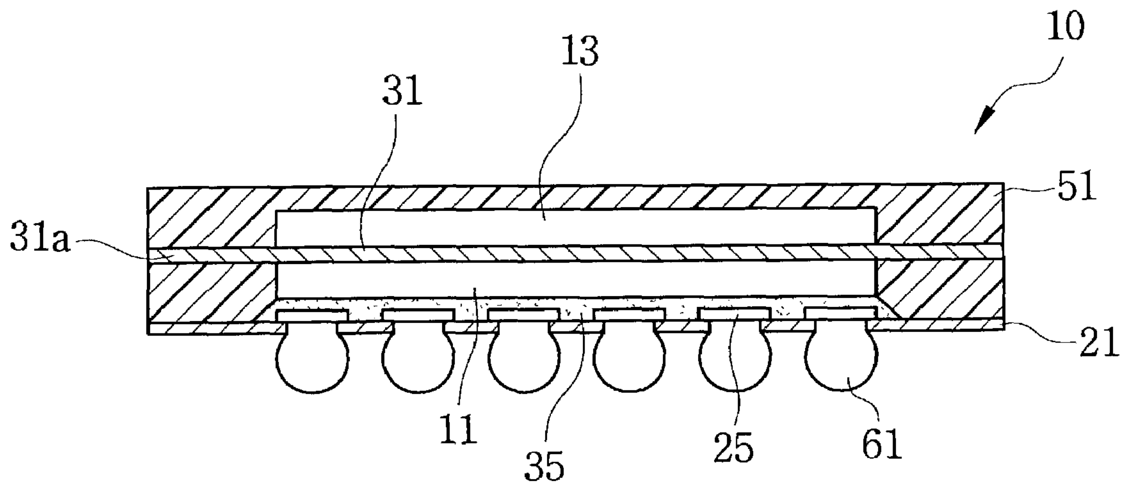
FIG. 4 is a cross-sectional view taken along line 4—4 of FIG. 2.

FIG. 2 is a perspective bottom view of a multi-chip package in accordance with an embodiment of the present invention. FIGS. 3 and 4 are cross-sectional views taken along line 3—3 and line 4—4 of FIG. 2, respectively. As shown in FIGS. 2 to 4, a multi-chip package 10 comprises a first chip 11 mounted on a substrate 21, a spacer 31 attached to the top surface 11*a* of the first chip 11, and a second chip 13 mounted on the spacer 31. Chip pads 12 of the first chip 11 and chip pads 14 of the second chip 13 are electrically connected to corresponding bonding pads 23 of the substrate 21 by bonding wires 41, 43, respectively. The height of the wire loop of the bonding wire 41 is protected by the spacer 31 interposed between the first chip 11 and the second chip 13.

Both the first chip 11 and the second chip 13 are edge pad types, each having the chip pads 12, 14 on the opposing edges of the active surface. The active surfaces of the first and second chips 11 and 13 are upward. The back surface 11*b* of the first chip 11 is mounted facing the substrate 21 and the back surface 13*b* of the second chip 13 is mounted facing the active surface of the first chip 11. The spacer 31 is traverse attached to the active surface of the first chip 11 between the opposite chip pads 12. The first chip 11, the second chip 13, and the bonding wires 41, 43 are encapsulated with an encapsulant, thereby forming a package body 51. Ends 31*a* of the spacers 31 extend to the edge of the package body 51. Solder balls 61 are attached to corresponding land patterns 25 of the substrate 21. The solder balls 61 are electrically connected to the first chip 11 and the second chip 13 by bonding the solder balls 61 to the bonding pads 23 via circuit wirings within the substrate 21. An adhesive 35 such as Ag-epoxy may be used to attach the first chip 11 to the substrate 21. A tape wiring board (TWB) or a printed circuit board (PCB) may be used as the substrate 21.

This multi-chip package of the present invention is manufactured by stacking same or different types of semiconductor chips with the same or similar size. The wire-bonding between the lower chip and the substrate can be achieved by using the spacer 31. Compared to the conventional package, the manufacturing process of the multi-chip package of the present invention is simplified. The manufacturing process is described below.

Figure 5:
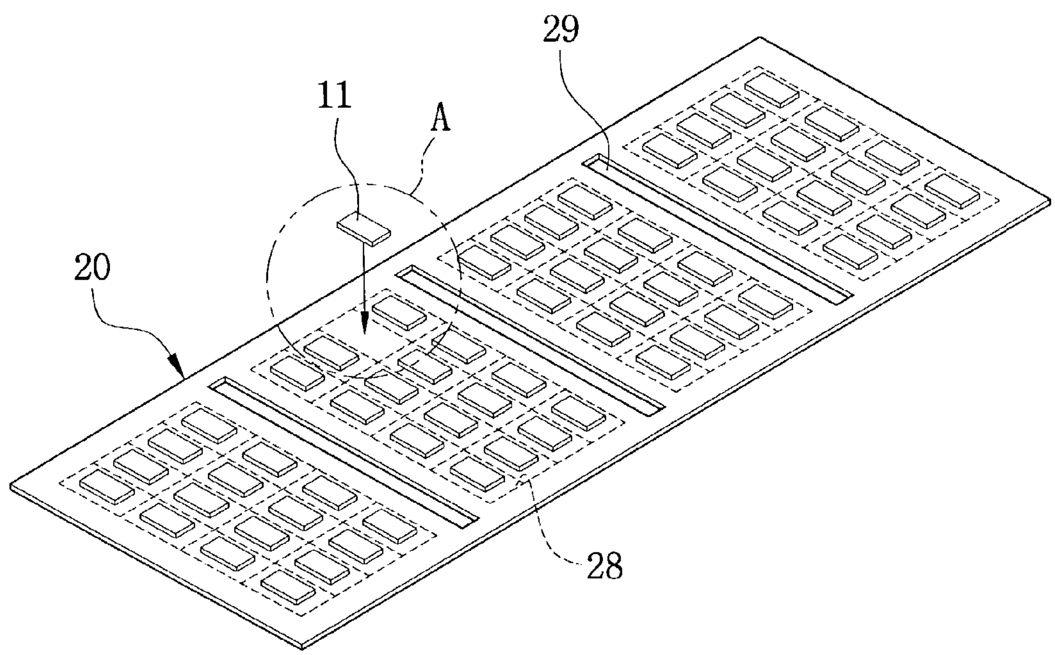
FIGS. 5 to 13 illustrate a manufacturing process of the multi-chip package of FIG. 2.
Figure 6:
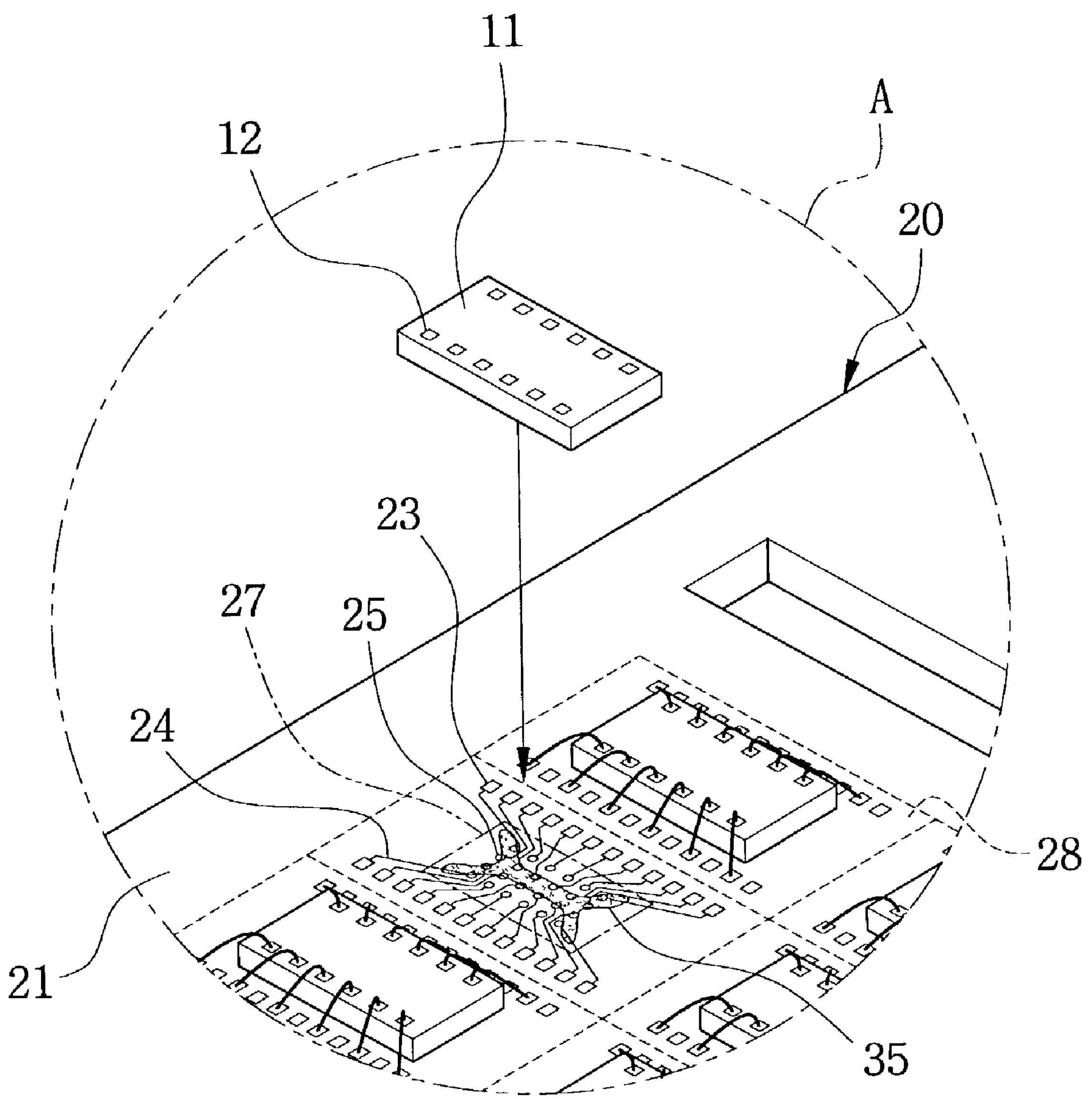

FIG. 5 is a perspective view illustrating a step of attaching the semiconductor chip on the substrate. FIG. 6 is an enlarged view of a portion “A” of FIG. 5. As shown in FIGS. 5 and 6, a substrate strip 20 is prepared. The substrate strip 20 includes a plurality of package areas 28, each with a chip mounting area 27. The first chip 11 is attached to the chip mounting area 27 of the substrate strip 20. The package areas 28 of the substrate strip 20 are grouped into matrix arrangements. As shown in FIG. 5, the substrate strip 20 includes four groups, each group having plural package areas 28 in 4×4 arrangement, and separated by slots 29. Land pads 25 are formed within the chip mounting area 27 and bonding pads 23 are formed on two peripheral edges of the chip mounting area 27. The land pads 25 are connected to the corresponding bonding pads 23 by circuit wirings 24. The first chip 11 is an edge pad type with the chip pads 12 on two opposite edges of the active surface. After coating an adhesive 35 such as an Ag-epoxy on the chip mounting area 27, the back surface 11*b* of the first chip 11 is attached to the chip mounting area 27. The above-described chip attachment step of the first chip 11 may be carried out collectively for the whole strip, or by a group, or individually by a single package.

Figure 7:
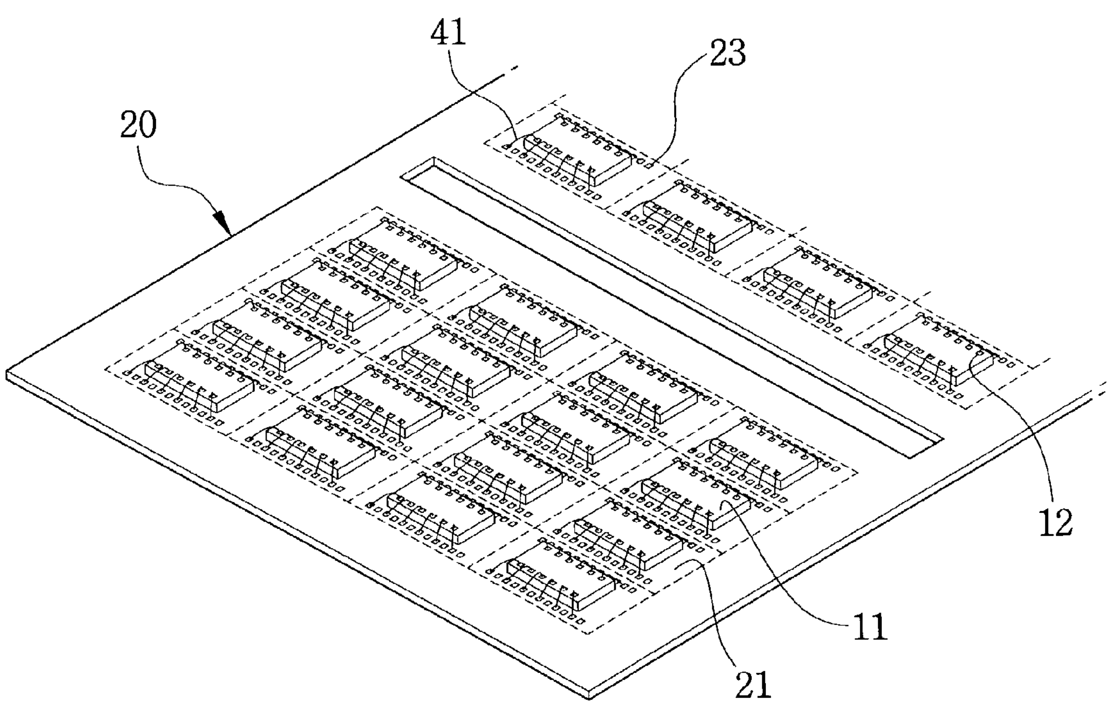

FIG. 7 is a perspective view illustrating a first wire-bonding step of the manufacturing process of the present invention. As shown in FIG. 7, the first wire-bonding step is carried out to electrically connect the first chip 11 to the substrate 21. The chip pads 12 of the first chip 11 are connected to the corresponding bonding pads 23 of the substrate 21 by conductive metal wires 41 such as Au wires.

Figure 8:
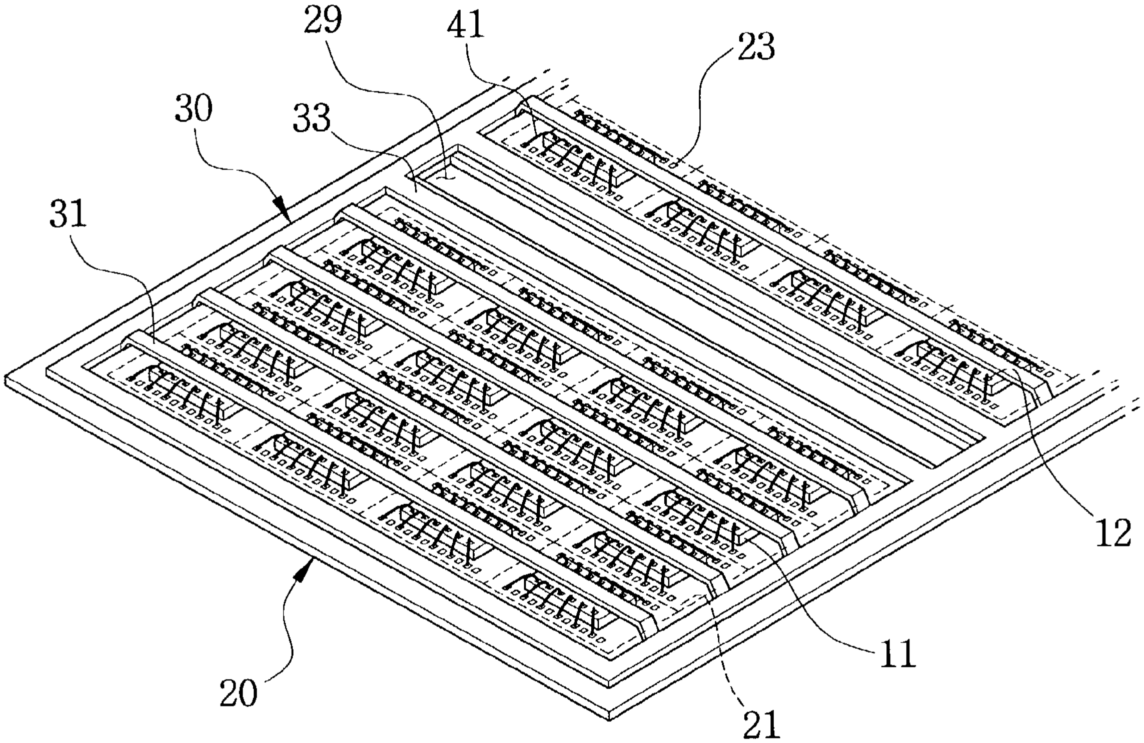

FIG. 8 is a perspective view illustrating a step of attaching a spacer strip. As shown in FIG. 8, a spacer strip 30 is attached to the substrate strip 20 which has first chips 11 previously attached. The spacer strip 30 comprises a plurality of spacers 31 in bar form, with the bars corresponding to the columns of the first chips 11. As shown in FIG. 8, the spacer strip 30 is attached to the substrate strip 20 so that the spacer 31 is located between the opposite chip pads 12 on the active surface of the first chip 11. The spacer strip 30 is made of Cu-alloy, Ni-alloy, FR-4, or silicon.

Figure 9:
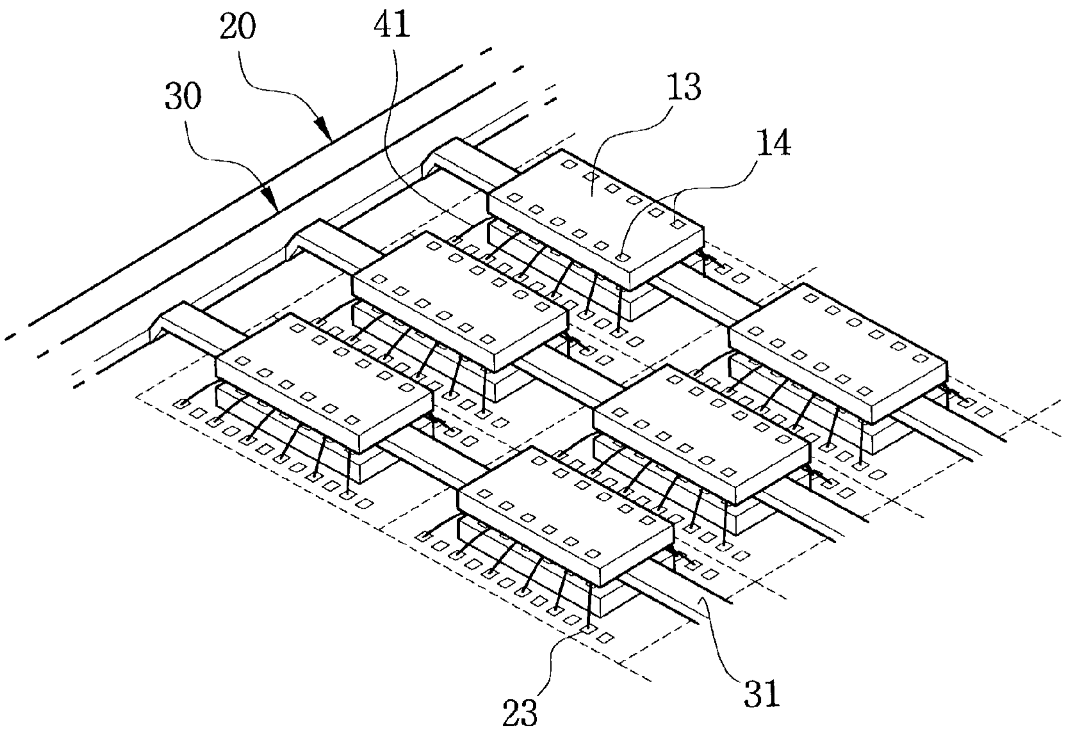

FIG. 9 is a perspective view illustrating a step of attaching second chips. As shown in FIG. 9, the second chips 13 are attached to the spacers 31. The second chip 13 is of the same type as the first chip 11. That is, the second chip 13 is an edge pad type with the chip pads 14 on the opposing two edges of the active surface 13*a* of second chip 13. The back surface 13*b* of the second chip 13 is attached to the spacer 31. As shown in FIG. 9, the second chips 13 are located above the corresponding first chips 11. Since the spacer 31 is interposed between the first chip 11 and the second chip 13, the back surface of the second chip 13 does not contact the wires 41. The above-described chip attachment step of the second chip 13 also may be carried out collectively in whole strip or by a group, or individually by a package.

Figure 10:
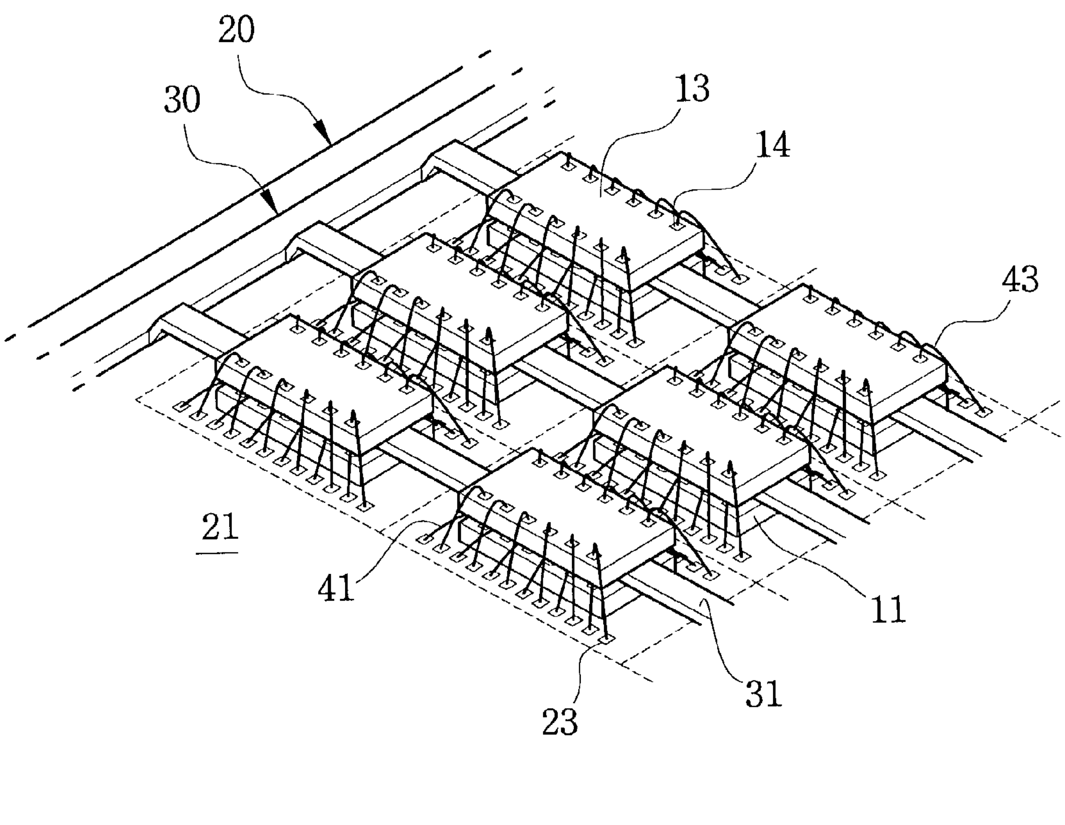
Figure 11:
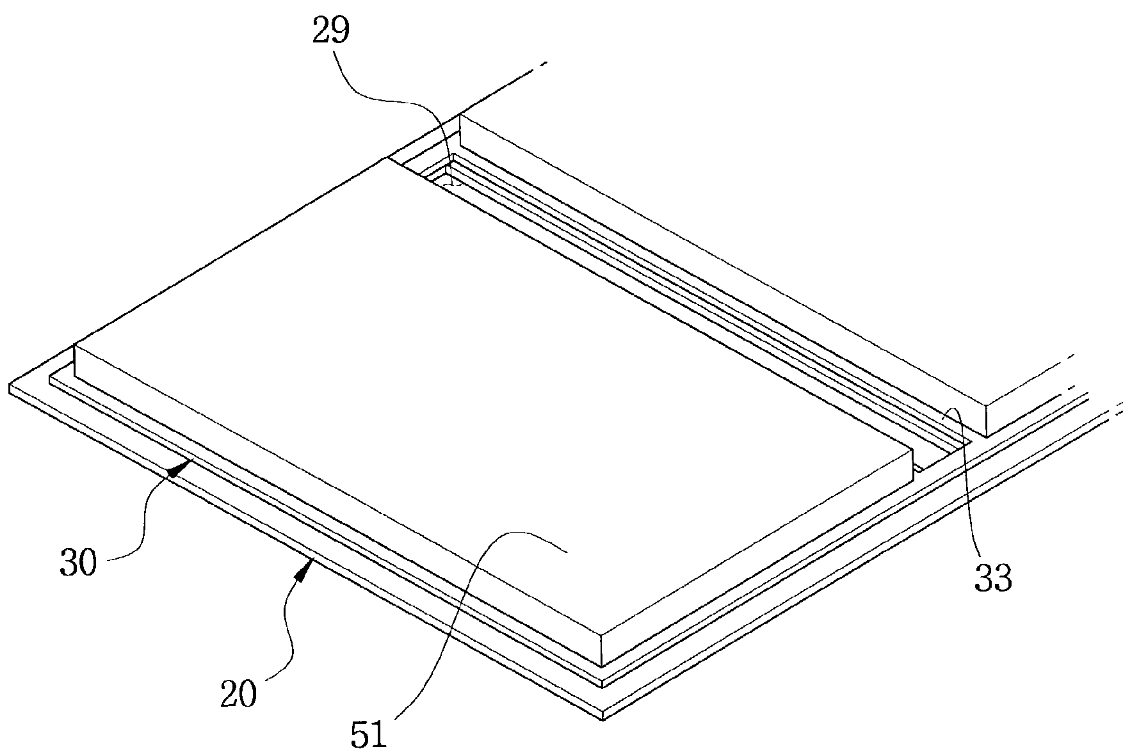
Figure 12:
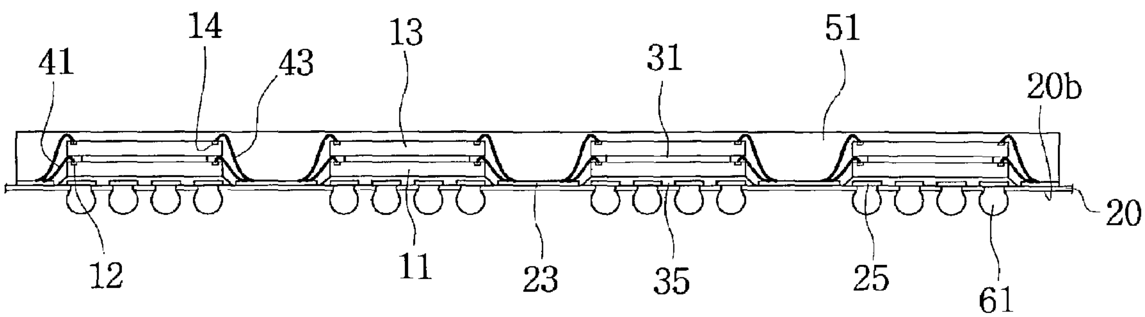

FIG. 10 is a perspective view illustrating a second wire-bonding step of the present invention. FIG. 11 is a perspective view illustrating an encapsulating step, and FIG. 12 is a cross-sectional view illustrating a step of attaching external connection terminals. As shown in FIGS. 10 and 11, the second wire-bonding step is carried out to electrically connect the second chip 13 to the substrate 21. The chip pads 14 of the second chip 13 are connected to the corresponding bonding pads 23 of the substrate 21 by conductive metal wires 43. The whole assembly including the first chip 11, the second chip 13, the spacer 31, the conductive wires 41, 43 and the electrical connection parts are encapsulated with an epoxy molding resin to form a package body 51. The encapsulation step is carried out collectively in a strip or by a group. Dam bars 33 of the spacer strip 30 serve as dams in the encapsulation step.

As shown in FIG. 12, the external connection terminals 61 such as solder balls are attached to the bottom surface 20*b* of the substrate strip 20. The external connection terminals 61 are attached to the corresponding land pads 25 of the substrate 21 and electrically connected to the first chip 11 and the second chip 13.

Figure 13:
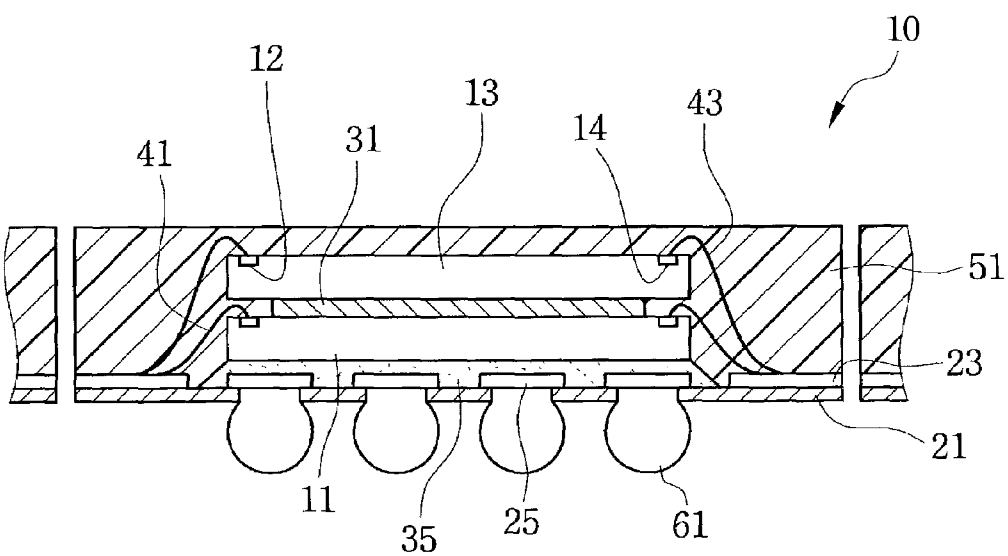

FIG. 13 is a cross-sectional view illustrating a step of cutting the substrate strip 20 into plural unit multi-chip packages 10. The substrate strip 20 is cut into the unit multi-chip packages 10 by a diamond blade or a laser. Thereby, the cut ends of the spacer 31 extend to the edge the package body 51.

According to the present invention, a small-sized multi-chip package with a plurality of stacked chips is manufactured by interposing a spacer between the chips. Furthermore, the assembly and packaging process of the multi-chip package is carried out on a substrate strip, thereby collectively obtaining a plurality of multi-chip packages. Also, the spacers in a strip are collectively attached to the substrate strip provided with plural packages. Therefore, the present invention improves the productivity and further reduces the production cost.

Although the preferred embodiments of the present invention have been described in detail hereinabove, it should be understood that many variations and/or modifications of the basic inventive concepts that appear to those skilled in the art will still fall within the spirit and scope of the present invention as defined in the appended claims.

What is claimed is:

1. A multi-chip comprising:

a substrate having a top surface and a bottom surface;

a first chip attached to the top surface of the substrate, wherein the first chip comprises an active surface;

a spacer mounted on the active surface of the first chip;

a second chip comprising an active surface and a back surface, wherein the back surface of the second chip is mounted on the spacer; and a package body formed by encapsulating the first chip and the second chip, wherein side surface of the ends of the spacer are exposed to outside of the package body.

2. The multi-chip package of claim 1, further comprising:

first chip pads attached to the active surface of the first chip;

second chip pads attached to the active surface of the second chip;

first and second bonding wires electronically connecting the first and second chips to the substrate; and external connection terminals attached to the bottom surface of the substrate, wherein the package body encapsulate the first and second bonding wires.

3. The multi-chip package of claim 2, wherein the first bonding wires are attached to the active surface of the first chip and to the substrate.

4. The multi-chip package of claim 1, wherein the first chip is an edge pad type with chip pads on opposite edges of the active surface of the first chip.

5. The multi-chip package of claim 4, wherein the spacer is mounted on the first chip in between the opposite chip pads of the first chip.

6. The multi-chip package of claim 1, wherein the spacer comprises a material selected from the group consisting of Cu-alloy and Ni-alloy.

7. The multi-chip package of claim 1, wherein the spaces comprises FR-4 or silicon.

8. The multi-chip package of claim 1, wherein the active surface of the first chip and the second chip face in the same direction.

9. The multi-chip package of claim 1, wherein the first chip and the second chip are edge pad types.

10. The multi-chip package of claim 1, wherein the first chip and the second chip have the same pad type.

11. The multi-chip package of claim 1, wherein the substrate comprises a tape wiring board.

12. The multi-chip package of claim 1, wherein the substrate comprises printed circuit board.

* * * * *